United States Patent
Brusic et al.

(10) Patent No.: US 8,623,767 B2
(45) Date of Patent: Jan. 7, 2014

(54) METHOD FOR POLISHING ALUMINUM/COPPER AND TITANIUM IN DAMASCENE STRUCTURES

(71) Applicant: Cabot Microelectronics Corporation, Aurora, IL (US)

(72) Inventors: Vlasta Brusic, Geneva, IL (US); Christopher Thompson, St. Steven's Church, VA (US); Jeffrey Dysard, St. Charles, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 13/846,126

(22) Filed: Mar. 18, 2013

(65) Prior Publication Data

US 2013/0224955 A1     Aug. 29, 2013

Related U.S. Application Data

(62) Division of application No. 12/052,970, filed on Mar. 21, 2008, now Pat. No. 8,425,797.

(51) Int. Cl.
*H01L 21/302* (2006.01)

(52) U.S. Cl.
USPC .......... 438/693; 438/692; 252/79.1; 252/79.4

(58) Field of Classification Search
None
See application file for complete search history.

(56) References Cited

U.S. PATENT DOCUMENTS

| | | | | |
|---|---|---|---|---|
| 6,478,834 | B2 * | 11/2002 | Tsuchiya et al. | 51/307 |
| 6,620,215 | B2 * | 9/2003 | Li et al. | 51/298 |
| 2003/0159362 | A1 * | 8/2003 | Singh et al. | 51/293 |
| 2003/0228763 | A1 * | 12/2003 | Schroeder et al. | 438/691 |
| 2005/0076581 | A1 * | 4/2005 | Small et al. | 51/307 |
| 2007/0090094 | A1 * | 4/2007 | Thompson et al. | 216/89 |

* cited by examiner

*Primary Examiner* — Binh X Tran
*Assistant Examiner* — David Cathey, Jr.
(74) *Attorney, Agent, or Firm* — Thomas E. Omholt; Steven D. Weseman

(57) ABSTRACT

The invention provides compositions and methods for planarizing or polishing a substrate. The composition comprises an abrasive consisting of alumina particles optionally treated with a polymer, an α-hydroxycarboxylic acid, an oxidizing agent that oxidizes at least one metal, polyacrylic acid, optionally, a calcium-containing compound, optionally, a biocide, optionally, a pH adjusting agent, and water. The method uses the composition to chemically-mechanically polish a substrate.

9 Claims, No Drawings

METHOD FOR POLISHING ALUMINUM/COPPER AND TITANIUM IN DAMASCENE STRUCTURES

BACKGROUND OF THE INVENTION

Integrated circuits are made up of millions of active devices formed in or on a substrate, such as a silicon wafer. The active devices are chemically and physically connected into a substrate and are interconnected through the use of multilevel interconnects to form functional circuits. In one manufacturing process, a dielectric substrate is patterned by a conventional dry etch process to form holes and trenches for vertical and horizontal interconnects. The patterned surface is then optionally coated with a diffusion barrier layer and/or an adhesion-promoting layer, followed by deposition of a metal layer to fill the trenches and holes. Chemical-mechanical polishing (CMP) is employed to reduce the thickness of the metal layer, as well as the thickness of the diffusion barrier layer and, or adhesion-promoting layer, until the underlying dielectric layer is exposed, thereby forming the circuit device.

One way to fabricate planar metal circuit traces on a silicon dioxide substrate is referred to as the damascene process. In accordance with this process, the silicon dioxide dielectric surface having optionally a layer of silicon nitride deposited thereon is patterned by applying a photoresist, exposing the photoresist to irradiation through a pattern to define trenches and/or vias, and then using a conventional dry etch process to form holes and trenches for vertical and horizontal interconnects. The silicon nitride functions as a "hard mask" to protect the silicon dioxide surface that is not part of the trenches and/or vias from damage during etching. The patterned surface is coated with an adhesion-promoting layer such as titanium or tantalum and/or a diffusion barrier layer such as titanium nitride or tantalum nitride. The adhesion-promoting layer and/or the diffusion barrier layer are then over-coated with a metal layer. Chemical-mechanical polishing is employed to reduce the thickness of the metal over-layer, as well as the thickness of any adhesion-promoting layer and/or diffusion barrier layer, until a planar surface that exposes elevated portions of the silicon nitride surface is obtained. The vias and trenches remain filled with electrically conductive metal forming the circuit interconnects.

Tungsten and copper have been increasingly used as the electrically conductive metal. However, aluminum, which has been used in earlier generation processes to fabricate circuit interconnects via subtractive processes such as etching techniques, is now under consideration for use in damascene processes. The combination of aluminum and titanium offers potentially lower resistivity than other metal/barrier layer combinations, with corresponding potential improvement in circuit performance. However, compositions useful in the chemical-mechanical polishing of aluminum typically exhibit considerably lower removal rates in the polishing of underlying titanium. Thus, the use of such polishing compositions in aluminum damascene fabrication processes to polish aluminum as well as titanium require the overpolishing of aluminum remaining in circuit lines, thereby resulting in considerable dishing of the lines. There remains in the art a need for improved compositions and methods for the chemical-mechanical polishing of substrates comprising aluminum as a conducting material and titanium as a barrier material.

BRIEF SUMMARY OF THE INVENTION

The invention provides a chemical-mechanical polishing composition for polishing a substrate. The chemical-mechanical polishing composition comprises, consists essentially of, or consists of (a) an abrasive consisting of alumina particles optionally treated with a polymer, (b) an α-hydroxycarboxylic acid, (c) an oxidizing agent that oxidizes at least one metal, (d) about 0.01 wt. % to about 0.2 wt. % polyacrylic acid, (e) optionally, a calcium-containing compound, (f) optionally, a biocide, (g) optionally, a pH adjusting agent, and (h) water, wherein the polishing composition has a pH of about 2 to about 6.

The invention further provides a method of chemically-mechanically polishing a substrate, which method comprises (i) contacting a substrate with a polishing pad and a chemical-mechanical polishing composition comprising, consisting essentially of, or consisting of (a) an abrasive consisting of alumina particles optionally treated with a polymer, (b) an α-hydroxycarboxylic acid, (c) an oxidizing agent that oxidizes at least one metal, (d) about 0.01 wt. % to about 0.2 wt. % polyacrylic acid, (e) optionally, a calcium-containing compound, (f) optionally, a biocide, (g) optionally, a pH adjusting agent, and (h) water wherein the polishing composition has a pH of about 2 to about 6, (ii) moving the polishing pad relative to the substrate with the chemical-mechanical polishing composition therebetween, and, (iii) abrading at least a portion of the substrate to polish the substrate.

DETAILED DESCRIPTION OF THE INVENTION

The invention provides a chemical-mechanical polishing composition for polishing a substrate. The polishing composition comprises, consists essentially of, or consists of (a) an abrasive consisting of alumina particles optionally treated with a polymer, (b) an α-hydroxycarboxylic acid, (c) an oxidizing agent that oxidizes at least one metal, (d) about 0.01 wt. % to about 0.2 wt. % polyacrylic acid, (e) optionally, a calcium-containing compound, (f) optionally, a biocide, (g) optionally, a pH adjusting agent, and (h) water, wherein the polishing composition has a pH of about 2 to about 6.

The polishing composition contains an abrasive consisting of alumina particles. Preferably, the alumina is fumed alumina or a non-fumed α-alumina. The abrasive particles typically have an average particle size (e.g., average particle diameter) of about 20 nm (e.g., about 30 nm or more, about 40 nm or more, about 50 nm or more, or about 75 nm or more). The abrasive particles typically have an average particle size of about 500 nm or less (e.g., about 400 nm or less, about 300 nm or less, about 250 nm or less, or about 200 nm or less). Fumed alumina generally is in the form of aggregates of primary particles, which aggregates are not easily degraded into individual primary particles without significant energy inputs. While the primary particles generally are spherical, the aggregates are chain-like structures of the primary particles and generally are not spherical. Non-fumed α-alumina is a crystalline form of alumina and typically does not form aggregates. Particle size refers to the diameter of the smallest sphere that encloses the particle.

The polishing composition can comprise any suitable amount of alumina. Typically, the polishing composition comprises about 0.01 wt. % or more (e.g., about 0.05 wt. % or more, or about 0.1 wt. % or more) of alumina. Preferably, the polishing composition comprises about 2 wt. % or less (e.g. about 1 wt. % or less, or about 0.75 wt. % or less) of alumina. Even more preferably, the polishing composition comprises about 0.01 wt. % to about 2 wt. % (e.g., about 0.05 wt. % to about 1 wt. %, or about 0.1 wt. % to about 1 wt. %, or even about 0.1 wt. % to about 0.75 wt. %) of alumina.

At least a portion of the surface of the alumina, especially when the alumina is α-alumina, can be coated with a polymer.

For example, about 5 wt. % or more (e.g., about 10 wt. % or more, or about 50 wt % or more, or substantially all, or all) of the surface of the alumina can be coated with a polymer. The polymer can be any suitable polymer. Preferably, the polymer is an anionic polymer. More preferably, the anionic polymer is poly(2-acrylamido-2-methylpropane sulfonic acid) or polystyrenesulfonic acid.

When the surface of the alumina is coated with a polymer, the weight ratio of the polymer to the alumina is generally about 0.01 or more (e.g., about 0.05 or more, or about 10 or more, or about 0.16 or more, or about 0.2 or more), based on the weight of the alumina. Preferably, the weight ratio of the polymer to the alumina is about 3 or less (e.g. about 2 or less, or about 1 or less). The alumina can be treated with a polymer at any suitable time. For example, the alumina can be treated with a polymer in a separate step to prepare pretreated alumina prior to addition of the pretreated alumina to the other components of the polishing composition. In another embodiment, the polymer can be separately added to the polishing composition before, during, or after addition of the alumina to the polishing composition. In this regard, the weight ratio of polymer to alumina will be understood to refer to the total weight of polymer in the polishing composition and is not limited to polymer bound to the alumina.

The abrasive desirably is suspended in the polishing composition, more specifically in the water component of the polishing composition. When the abrasive is suspended in the polishing composition, the abrasive preferably is colloidally stable. The term colloid refers to the suspension of abrasive particles in the liquid carrier. Colloidal stability refers to the maintenance of that suspension over time, in the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of [B]–[T]/[C] desirably is less than or equal to 0.3, and preferably is less than or equal to 0.1.

The polishing composition contains an α-hydroxycarboxylic acid. The α-hydroxycarboxylic acid can be any suitable n-hydroxycarboxylic acid. Non-limiting examples of suitable α-hydroxycarboxylic acids include lactic acid, α-hydroxybutyric acid, and glycolic acid. Preferably, the α-hydroxycarboxylic acid is lactic acid. The polishing composition contains about 0.1 wt. % to about 3 wt. % (e.g., about 0.25 wt. % to about 2.5 wt. %, or about 0.5 wt. % to about 2 wt. %, or even about 1 wt. % to about 2 wt. %) of α-hydroxycarboxylic acid. The α-hydroxycarboxylic acid can be provided as the free acid or as any suitable salt thereof.

The polishing composition contains an oxidizing agent. The function of the oxidizing agent is to oxidize at least one metal, such as a layer or layers comprising a metal selected from the group consisting of aluminum, an alloy of aluminum and copper (i.e., aluminum-copper), titanium, and titanium nitride. The oxidizing agent can be any suitable oxidizing agent. Non-limiting examples of suitable oxidizing agents include hydrogen peroxide, persulfate salts (e.g., ammonium persulfate), ferric nitrate, solid forms of hydrogen peroxide, and combinations thereof. Solid forms of hydrogen peroxide include sodium percarbonate, calcium peroxide, and magnesium peroxide, which liberate free hydrogen peroxide when dissolved in water. Preferably, the oxidizing agent is hydrogen peroxide.

The polishing composition can contain any suitable amount of oxidizing agent. Typically the polishing composition contains about 0.1 wt. % or more (e.g., about 0.5 wt. % or more, or about 1 wt. % or more) oxidizing agent. Preferably, the polishing composition contains about 10 wt. % or less (e.g., about 8 wt. % or less, or about 5 wt. % or less) oxidizing agent. More preferably, the polishing composition contains about 0.1 wt. % to about 8 wt. % (e.g., about 1 wt. % to about 5 wt. %) oxidizing agent.

The polishing composition contains polyacrylic acid. The polyacrylic acid typically has a molecular weight of about 2000 or more (e.g., about 3000 or more, or about 4000 or more). Preferably, the polyacrylic acid as a molecular weight of about 50000 or less (e.g., about 25000 or less, or about 20000 or less). More preferably, the polyacrylic acid has a molecular weight of about 3000 to about 25000 (e.g., about 4000 to about 20000). If the molecular weight of polyacrylic acid is too low, the polishing composition may not exhibit reduced dishing when used to polish substrates comprising aluminum-copper. If the molecular weight of polyacrylic acid is too high, the colloidal stability of the polishing composition may be compromised.

Typically, the polishing composition contains about 10 ppm or more of polyacrylic acid (e.g., about 25 ppm or more, or about 50 ppm or more, or about 100 ppm or more). Preferably, the polishing composition contains about 2000 ppm or less (e.g., about 1000 ppm or less, or about 500 ppm or less, or about 400 ppm or less, or even about 300 ppm or less) of polyacrylic acid. More preferably, the polishing composition contains about 100 ppm to about 2000 ppm (e.g., about 200 ppm to about 1000 ppm, or about 200 ppm to about 600 ppm) of polyacrylic acid.

The polishing composition optionally further contains a calcium-containing compound. When a calcium-containing compound is present, the polishing composition typically contains a sufficient amount of the calcium-containing compound to provide about ppm or more (e.g., about 25 ppm or more, or about 50 ppm or more) of calcium ion. Preferably, the polishing composition contains a sufficient a mount of the calcium-containing compound to provide about 500 ppm or less (e.g., about 400 ppm or less, or about 300 ppm or less, or about 250 ppm or less, or even about 200 ppm or less) of calcium ion. More preferably, the polishing composition contains a sufficient amount of the calcium-containing compound to provide about 10 ppm to about 500 ppm (e.g., about 25 ppm to about 250 ppm, or about 50 ppm to about 200 ppm) of calcium ion. Advantageously, the presence of calcium ion provided by the calcium-containing compound provides for enhancement of the removal rate of titanium layers exhibited by the inventive polishing composition. The calcium ion contained in the polishing composition can be provided by one or more suitable calcium-containing compounds. Preferably, the calcium-containing compound is at least one water-soluble calcium salt. Non-limiting examples of suitable calcium salts include calcium acetate and calcium chloride, hydrates thereof, and combinations thereof.

The polishing composition optionally further contains a biocide. The biocide can be any suitable biocide, for example an isothiazolinone biocide. The amount of biocide used in the polishing composition typically is about 1 ppm to about 500 ppm, and preferably is about 10 ppm to about 200 ppm.

The polishing composition has a pH of about 7 or less (e.g., about 6 or less). Preferably, the polishing composition has a pH of about 1 or more (e.g., about 1.5 or more, or about 2 or more). Even more preferably, the polishing composition has a pH of about 2 to about 6 (e.g., about 2 to about 4). The polishing composition optionally comprises pH adjusting agents, for example, potassium hydroxide, ammonium hydroxide, alkylammonium hydroxides, and/or nitric acid. Without wishing to be bound by theory, it is believed that polyacrylic acid is bound to the oxidized surface of an aluminum surface being polished by means of hydrogen bonds with the result that dishing is reduced. If the pH of the polishing composition is too high, an insufficient number of acrylic acid subunits in the polyacrylic acid are protonated to provide for effective binding of the polyacrylic acid to the oxidized surface of the aluminum surface being polished.

When the polishing composition consists essentially or of consists of the aforementioned components, the polishing composition typically excludes corrosion inhibitors (e.g., heterocyclic compounds comprising nitrogen atoms, phosphonic acid and derivatives thereof and the like) and surfactants (e.g., polymeric compounds other than polyacrylic acid and the polymer used to treat the alumina).

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, oxidizing agent, etc.) as well as any combination of ingredients (e.g., abrasive, oxidizing agent, α-hydroxycarboxylic acid, polyacrylic acid, etc.).

For example, the x-hydroxycarboxylic acid, oxidizing agent, polyacrylic acid, optional calcium-containing compound, and optional biocide can be dissolved in water by addition of the α-hydroxycarboxylic acid, oxidizing agent, polyacrylic acid, optional calcium-containing compound, and optional biocide to water in any order, or even simultaneously. The abrasive can then be added and dispersed by any method that is capable of dispersing the abrasive in the polishing composition. If the abrasive is treated with a polymer, the abrasive can be pretreated with the polymer prior to addition to the polishing composition. In other embodiments, the polymer can be added to water with the other components prior to, or after, addition of the abrasive. The polishing composition can be prepared prior to use, with one or more components, such as the oxidizing agent, added to the polishing composition shortly before use (e.g., within about 1 minute before use, or within about 1 hour before use, or within about 7 days before use). The pH can be adjusted at any suitable time, and is preferably adjusted prior to the addition of the abrasive to the polishing composition. The polishing composition also can be prepared by mixing the components at the surface of the substrate during the polishing operation.

The polishing composition also can be provided as a concentrate which is intended to be diluted with an appropriate amount of water and typically the oxidizing agent prior to use. If the oxidizing agent is a liquid, an appropriate volume of the oxidizing agent can be added to the water prior to dilution of the concentrate with the water, or an appropriate volume of the oxidizing agent can be added to the concentrate before, during, or after addition of the water to the concentrate. If the oxidizing agent is a solid, the oxidizing agent can be dissolved in the water or a portion thereof before dilution of the concentrate with the water and/or an aqueous solution of the oxidizing agent. A solid oxidizing agent also can be added as a solid to the concentrate before, during, or after dilution of the concentrate with the water to provide the polishing composition. The oxidizing agent can be incorporated into the polishing composition by any suitable method capable of incorporating the oxidizing agent into the polishing composition, such as by mixing.

The polishing composition concentrate can comprise an abrasive, α-hydroxycarboxylic acid, polyacrylic acid, optional calcium-containing compound, optional biocide, optional pH adjusting agent, and water in amounts such that, upon dilution of the concentrate with an appropriate amount of water and oxidizing agent, each component of the polishing composition will be present in the polishing composition in an amount within the appropriate range recited above for each component. For example, the abrasive, α-hydroxycarboxylic acid, polyacrylic acid, optional calcium-containing compound, optional pH adjusting agent, and optional biocide can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively) and an appropriate amount of oxidizing agent, each component will be present in the polishing composition in an amount within the ranges set forth above for each component. Preferably, the water-soluble components present in the concentrate, such as the α-hydroxycarboxylic acid, polyacrylic acid, optional calcium-containing compound, optional pH adjusting agent, and optional biocide will be present in amounts such that the components are fully dissolved in the water of the concentrate, and in amounts such that the concentration of the water-soluble components in the concentrate, more specifically in the water of the concentrate, is less than the maximum solubility of the water-soluble components in the water of the concentrate at ambient conditions (e.g., at a temperature of about 20° C.). Furthermore, the concentrate can contain an appropriate fraction of the water, along with optionally some or all of the oxidizing agent, present in the final polishing composition in order to ensure that the α-hydroxycarboxylic acid, polyacrylic acid, optional calcium-containing compound, optional biocide, and optional pH adjusting agent, are at least partially or fully dissolved in the concentrate, preferably are fully dissolved in the concentrate.

The invention further provides a method of chemically-mechanically polishing a substrate comprising (i) contacting a substrate with a polishing pad and the polishing composition described herein, (ii) moving the polishing pad relative to the substrate with the polishing composition therebetween, and (iii) abrading at least a portion of the substrate to polish the substrate.

Although the polishing composition of the invention is useful for polishing any substrate (e.g., an integrated circuit, metals, ILD layers, semiconductors, and thin films), the polishing composition is particularly useful in the polishing of a substrate comprising at least one metal layer comprising aluminum or an aluminum-containing alloy such as aluminum-copper, at least one metal layer comprising titanium, and at least one dielectric layer. The titanium can be in the form of titanium metal, alloys thereof, nitrides thereof, and combinations thereof. The dielectric layer can be a metal oxide, porous metal oxide, glass, organic polymer, fluorinated organic polymer, or any other suitable high or low-k insulating layer, and preferably is a silicon-based metal oxide. More preferably, the dielectric layer is a silicon oxide layer derived from tetraethylorthosilicate and is referred to herein as "TEOS." In the context of the invention the term "layer" refers both to a continuous, bulk layer of material having a substantially homogeneous surface and to a surface comprising the material contained within a surface feature (e.g., a circuit line or a via). Advantageously, the inventive polishing composition allows for a high removal rate for aluminum (e.g., aluminum-copper), while exhibiting a desirable selectivity ratio for the polishing of aluminum versus titanium as well as a very low dielectric removal rate, which renders the polishing composition suitable in a "one step" method of removing both excess aluminum and then underlying titanium to expose the dielectric layer. Moreover, the presence of polyacrylic acid in the inventive polishing composition desirably results in substantially less dishing of the substrate exhibited by the inventive polishing composition.

The following examples further illustrate the invention but, of course, should not be construed as in any way limiting its scope.

Example 1

Two similar sets of substrates, each of which substrates separately comprised aluminum-copper, titanium, tantalum, and TEOS, were polished with two different polishing compositions (Polishing Compositions 1A and 1B). Each of the polishing compositions contained 0.5 wt. % of α-alumina treated with poly(2-acrylamido-2-methylpropane sulfonic acid), 200 ppm polyacrylic acid, 14 ppm of Kathon 886 MW biocide, and 3 wt. % hydrogen peroxide, at a pH1 of 3.5. Polishing Compositions 1A and 1B further contained 0.5 wt % and 1.0 wt. % of lactic acid, respectively.

Following polishing, the removal rates (RR) for aluminum-copper, titanium, and TEOS were determined for each of the polishing compositions, and the results are summarized in Table 1.

TABLE 1

| Polishing Composition | Al—Cu RR (Å/min) | Ti RR (Å/min) | Ta RR (Å/min) | TEOS RR (Å/min) |
|---|---|---|---|---|
| 1A | 4611 | 1119 | 263 | 34 |
| 1B | 5817 | 1421 | 202 | 28 |

As is apparent from the results set forth in Table 1, increasing the concentration of lactic acid in the inventive polishing, composition from 0.5 wt. % to 1.0 wt. % resulted in an increase in the aluminum-copper and titanium removal rates of approximately 26% for both aluminum-copper and titanium, while the tantalum and TEOS removal rates were reduced by approximately 34% and 18%, respectively.

Example 2

Two similar substrates were prepared by sequentially depositing titanium and then aluminum-copper onto a patterned TEOS layer. The substrates were polished with two different polishing compositions (Polishing Compositions 2A and 2B). Each of the compositions contained 0.5 wt. % of α-alumina treated with poly(2-acrylamido-2-methylpropane sulfonic acid), 200 ppm polyacrylic acid, 14 ppm of Kathon 886 MW biocide, and 3 wt % hydrogen peroxide, at a pH of 3.5. Polishing Compositions 2A and 2B further contained 0.5 wt. % and 1.0 wt. % of lactic acid, respectively.

Following polishing, the dishing was determined for a 50 μm width isolated line, and the results are summarized in Table 2.

TABLE 2

| Polishing Composition | Dishing (Å) |
|---|---|
| 2A | 122 |
| 2B | 71 |

As is apparent from the results set forth in Table 2, increasing the concentration of lactic acid in the inventive polishing composition from 0.5 wt % to 1.0 wt. % resulted in a decrease in dishing of approximately 42% observed for a 50 rpm width isolated line.

Example 3

Four similar substrates comprising aluminum-copper were separately polished for 40 seconds with four different polishing compositions (Polishing Compositions 3A-3D) Each of the polishing compositions contained 0.5 wt. % α-alumina treated with poly(2-acrylamido-2-methylpropane sulfonic acid) and 3 wt. % hydrogen peroxide, at a pH of 3.5. Polishing Compositions 3A-3D further contained lactic acid and polyacrylic acid in amounts set forth in Table 3.

Following polishing, the removal rates (RR) for aluminum-copper were determined for each of the polishing compositions, and the results are summarized in Table 3.

TABLE 3

| Polishing Composition | Lactic Acid (wt. %) | Polyacrylic Acid (wt. %) | Al—Cu RR (Å/min) |
|---|---|---|---|
| 3A | 0.5 | 0.02 | 4483 |
| 3B | 0.5 | 0.06 | 1130 |
| 3C | 1.5 | 0.02 | 6391 |
| 3D | 1.5 | 0.06 | 1933 |

As is apparent from the results set forth in Table 3, increasing the amount of polyacrylic acid from 0.02 wt. % to 0.06 wt. % in a polishing composition containing 0.5 wt. % lactic acid resulted in a reduction of the aluminum-copper removal rate of approximately 75% (Polishing Compositions 3A and 3B). Increasing the amount of polyacrylic acid from 0.02 wt. % to 0.06 wt. % in a polishing composition containing 1.5 wt. % lactic acid resulted in a reduction of the aluminum-copper removal rate of approximately 70% (Polishing Compositions 3C and 3D). Increasing the amount of lactic acid from 0.5 wt. % to 1.5 wt. % in a polishing composition containing 0.02 wt. % polyacrylic acid resulted in an increase in the aluminum-copper removal rate of approximately 43% (Polishing Compositions 3A and 3C). Increasing the amount of lactic acid from 0.5 wt. % to 1.5 wt. % in a polishing composition containing 0.06 wt. % polyacrylic acid resulted in an increase in the aluminum-copper removal rate of approximately 71% (Polishing Compositions 3B and 3D).

Example 4

Two similar sets of substrates, each of which substrates separately comprised aluminum-copper, titanium, and TEOS, were polished with two different polishing compositions (Polishing Compositions 4A and 4B). Each of the polishing compositions contained 0.5 wt. % of α-alumina treated with poly(2-acrylamido-2-methylpropane sulfonic acid) and 3 wt. % hydrogen peroxide, at a pH of 3.5. Polishing Composition 4A further contained 3 wt. % succinic acid. Polishing Composition 4B further contained 1.5 wt. % lactic acid.

Following polishing, the removal rates (RR) for aluminum-copper, titanium, and TEOS were determined for each of the polishing compositions, and the selectivity for aluminum-copper versus TEOS was calculated. The results are summarized in Table 4.

TABLE 4

| Polishing Composition | Al—Cu RR (Å/min) | Ti RR (Å/min) | TEOS RR (Å/min) | Selectivity (Al/TEOS) |
|---|---|---|---|---|
| 4A | 3788 | 1304 | 43 | 88 |
| 4B | 4232 | 1623 | 38 | 111 |

As is apparent from the results set forth in Table 4, Polishing Composition 4B, which contained 1.5 wt. % lactic acid, exhibited an aluminum-copper removal rate that was approximately 12% greater and a titanium removal rate that was approximately 24% greater, as compared to the aluminum-copper and titanium removal rates exhibited by Polishing Composition 4A, which contained 3 wt. % succinic acid. In addition, Polishing Composition 4B exhibited a selectivity for aluminum versus TEOS which was approximately 26% greater than Polishing Composition 4A.

Example 5

Three similar sets of substrates, each of which substrates separately comprised aluminum-copper and titanium, were polished with three different polishing compositions (Polishing Compositions 5A-5C). Each of the polishing compositions contained 0.5 wt. % of α-alumina treated with poly(2-acrylamido-2-dimethylpropane sulfonic acid), 0.5 wt. % lactic acid, and 3 wt. % hydrogen peroxide, at a pH of 3.5. Polishing Composition 5A contained no additional components. Polishing Compositions 5B and 5C further contained 0.02 wt. % and 0.1 wt. % polyacrylic acid, respectively.

Following polishing, the removal rates (RR) for aluminum-copper and titanium were determined for each of the polishing compositions, and the selectivity for aluminum versus titanium was calculated. The results are summarized in Table 5.

TABLE 5

| Polishing Composition | Polyacrylic Acid (wt. %) | Al—Cu RR (Å/min) | Ti RR (Å/min) | Selectivity (Al/titanium) |
|---|---|---|---|---|
| 5A | 0 | 3521 | 1273 | 2.8 |
| 5B | 0.02 | 3996 | 1670 | 2.4 |
| 5C | 0.1 | 1373 | 1567 | 0.88 |

As is apparent from the results set forth in Table 5, Polishing Composition 5B, which contained 0.02 wt. % polyacrylic acid, exhibited aluminum-copper and titanium removal rates that were approximately 13% and 31% greater, respectively, than Polishing Composition 5A, which did not contain polyacrylic acid. Polishing Composition 5C, which contained 0.1 wt. % polyacrylic acid, exhibited aluminum-copper and titanium removal rates that were approximately 61% lower and 23% higher, respectively, than the aluminum-copper and titanium removal rates exhibited by Polishing Composition 5A.

Example 6

Two similar substrates comprising aluminum-copper were polished with two different polishing compositions (Polishing Compositions 6A and 6B). Each polishing composition contained 0.5 wt. % of α-alumina treated with poly(2-acrylamido-2-methylpropane sulfonic acid), 0.5 wt. % lactic acid, 0.02 wt. % polyacrylic acid, and 3 wt. % hydrogen peroxide. Polishing Composition 6A had a pH of 3.5, and Polishing Composition 6B had a pH of 8.4.

Following polishing, the removal rates (RR) for aluminum-copper were determined for each of the polishing compositions. The results are summarized in Table 6.

TABLE 6

| Polishing Composition | Al RR (Å/min) |
|---|---|
| 6A | 2795 |
| 6B | <1800 |

As is apparent from the results set forth in Table 6, Polishing Composition 6A having a pH of 3.5 exhibited an aluminum-copper removal rate that was at least 1.6 times greater than the aluminum-copper removal rate exhibited by Polishing Composition 68 having a pH of 8.4.

Example 7

Nine similar substrates were prepared by sequentially depositing titanium and then aluminum-copper onto a patterned TEOS layer. The substrates were then polished with eight different polishing compositions (Polishing Compositions 7A-7H). Each of the compositions contained 0.5 wt. % of α-alumina treated with poly(2-acrylamido-2-methylpropane sulfonic acid), 14 ppm of biocide, and 3 wt. % hydrogen peroxide, at a pH of 3.5. Polishing Composition 7A (control) did not contain any additional components. Polishing Composition 78 (invention) further contained 0.02 wt. % polyacrylic acid. Polishing Composition 7C (comparative) further contained 0.02 wt. % polymaleic acid. Polishing Composition 7D (comparative) further contained 0.045 wt. % polymaleic acid. Polishing 7E (comparative) further contained 0.001 wt. % polyvinyl alcohol Polishing 7F (comparative) further contained 0.02 wt. % polyvinyl alcohol. Polishing Composition 70 (comparative) further contained 0.001 wt. % polystyrenesulfonic acid. Polishing Composition 71 (comparative) further contained 0.02 wt. % polystyrenesulfonic acid. Two substrates were polished with Polishing Composition 7B (invention).

Following polishing, the dishing was determined for 10 μm and 50 μm width isolated lines, and the results are summarized in Table 7. The results reported for Polishing Composition 7B represent the average for two polishing experiments.

TABLE 7

| Polishing Composition | Al RR (Å/min) | Dishing, 10 μm line (Å) | Dishing, 50 μm line (Å) |
|---|---|---|---|
| 7A (control) | 2111 | 942 | 545 |
| 7B (invention) | 3000 | 76 | 81 |
| 7C (comparative) | 3281 | 826 | 350 |
| 7D (comparative) | 3088 | 769 | 293 |
| 7E (comparative) | 2979 | 895 | 402 |
| 7F (comparative) | 2763 | 868 | 410 |
| 7G (comparative) | 2800 | 876 | 351 |
| 7H (comparative) | 2917 | 746 | 224 |

As is apparent from the results set forth in Table 7. Polishing Composition 7B exhibited dishing on a 10 μm line that was 10% or less and dishing on a 50 μm line that was 36% or less than dishing exhibited by the control polishing composition or any of the comparative polishing compositions.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a substrate comprising at least one layer of aluminum, titanium, or an alloy of aluminum and copper, which method comprises:
   (i) contacting the substrate with a polishing pad and a chemical-mechanical polishing composition consisting essentially of:
      (a) an abrasive consisting of alumina particles treated with an anionic polymer, wherein the anionic polymer is poly(2-acrylamido-2-methylpropane sulfonic acid) or polystyrenesulfonic acid,
      (b) an α-hydroxycarboxylic acid,
      (c) an oxidizing agent that oxidizes at least one metal,
      (d) about 0.01 wt. % to about 0.2 wt. % polyacrylic acid,
      (e) optionally, a calcium-containing compound,
      (f) optionally, a biocide,
      (g) optionally, a pH adjusting agent, and
      (h) water,
      wherein the polishing composition has a pH of about 2 to about 6,
   (ii) moving the polishing pad relative to the substrate with the chemical-mechanical polishing composition therebetween, and
   (iii) abrading at least a portion of the substrate to polish the substrate.

2. The method of claim 1, wherein the abrasive is about 0.1 wt. % to about 1 wt. % of the polishing composition.

3. The method of claim 1, wherein the α-hydroxycarboxylic acid is lactic acid.

4. The method of claim 3, wherein the lactic acid is about 0.5 wt. % to about 2 wt. % of the polishing composition.

5. The method of claim 1, wherein the oxidizing agent is selected from the group consisting of ammonium persulfate, ferric nitrate, and combinations thereof.

6. The method of claim 1, wherein the oxidizing agent is hydrogen peroxide.

7. The method of claim 1, wherein the calcium-containing compound is about 0.001 wt. % to about 0.05 wt. % of the polishing composition.

8. The method of claim 1, wherein the polishing composition has a pH of about 2 to about 4.

9. The method of claim 1, wherein the substrate further comprises at least one layer of a dielectric material, and at least a portion of the dielectric material is removed to polish the substrate.

* * * * *